United States Patent
Samson

(10) Patent No.: US 7,330,389 B1
(45) Date of Patent: Feb. 12, 2008

(54) ADDRESS DETECTION SYSTEM AND METHOD THAT COMPENSATES FOR PROCESS, TEMPERATURE, AND/OR VOLTAGE FLUCTUATIONS

(75) Inventor: Bogdan Samson, Colorado Springs, CO (US)

(73) Assignee: Cypress Semiconductor Corp., San Jose, CA (US)

( * ) Notice: Subject to any disclaimer, the term of this patent is extended or adjusted under 35 U.S.C. 154(b) by 11 days.

(21) Appl. No.: 11/346,092

(22) Filed: Feb. 2, 2006

Related U.S. Application Data

(60) Provisional application No. 60/649,683, filed on Feb. 3, 2005.

(51) Int. Cl.
*G11C 7/02* (2006.01)
(52) U.S. Cl. .................. 365/207; 365/226; 365/196
(58) Field of Classification Search ............... 365/226, 365/207, 196
See application file for complete search history.

(56) References Cited

U.S. PATENT DOCUMENTS

| | | | | |
|---|---|---|---|---|
| 3,729,841 A | * | 5/1973 | Wagner | 36/118.8 |
| 5,184,033 A | * | 2/1993 | Chiao et al. | 326/87 |
| 5,293,081 A | * | 3/1994 | Chiao et al. | 327/108 |
| 5,751,642 A | * | 5/1998 | Yoo | 365/189.06 |
| 5,883,854 A | | 3/1999 | Becker | |
| 6,031,408 A | * | 2/2000 | Flannagan | 327/349 |

* cited by examiner

*Primary Examiner*—Thong Q. Le
(74) *Attorney, Agent, or Firm*—Kevin L. Daffer; Daffer McDaniel, LLP

(57) ABSTRACT

An address transition detector (ATD) system is provided with an integrator, a feedback circuit and an output circuit. The integrator has an enhanced architecture that ensures a fast output signal switching, low power consumption during the integration time, fast output transition at the end of the integration time and compensates the delay variations over process, voltage and temperature (PVT) fluctuations. The ATD system can be used in any asynchronous memory. In addition, the ATD integrator can be employed as a standalone circuit for use whenever a signal transition is to be delayed.

22 Claims, 5 Drawing Sheets

US 7,330,389 B1

ADDRESS DETECTION SYSTEM AND METHOD THAT COMPENSATES FOR PROCESS, TEMPERATURE, AND/OR VOLTAGE FLUCTUATIONS

PRIORITY APPLICATION

This application claims priority to U.S. Provisional Application No. 60/649,683 entitled "Address Transition Detector integrator Compensated over PVT" filed Feb. 3, 2005.

BACKGROUND OF THE INVENTION

1. Field of the Invention

The present invention relates in general to an integrated circuit and, more specifically, to an address transition detector (ATD) circuit that can produce a pulse that is time-consistent relative to an incoming address transition, regardless of process, voltage or temperature fluctuations to better control an asynchronous memory access time. The ATD circuit includes an integrator that can be employed as a standalone circuit for use whenever a signal transition is to be delayed.

2. Description of the Related Art

The following descriptions and examples are given as background only.

Most electronic systems require some form of storage. The storage device is used to temporarily or permanently store information used by the electronic system. The storage device or memory can be a mass storage device or hard drive or, alternatively, can be embodied upon silicon or a single monolithic substrate, and such forms are known as semiconductor memory. Popular semiconductor memories include random access memory (RAM), read-only memory (ROM), and various off-shoots of such memories.

To access the array of storage cells within semiconductor memory, an address bus, a data bus, and a control bus are needed. Accessing cells within a semiconductor memory array can occur either synchronously or asynchronously. In a synchronous memory device, data read/write cycles are controlled by a clocking signal. Whereas in an asynchronous memory device, data read/write is controlled by the address bus and the control bus.

In general the access time of an asynchronous memory is defined as the time between an address transition and the corresponding data read at the memory output. To improve the access time in an asynchronous memory the input address transitions are used to create an internal pulse that controls various circuits in order to obtain the output data faster. The circuit responsible for generating this pulse is generally known as an address transition detector (ATD) circuit.

In the following descriptions HI refers to a voltage level close or equal to the voltage on the power supply node (VDD), LO refers to a voltage level close or equal to the voltage on the ground supply node (VSS), Vtn refers to the gate transition voltage of a NMOS transistor and Vtp refers to the gate transition voltage of a PMOS transistor. Oftentimes, Vtn and Vtp refer to a threshold voltage in which the corresponding NMOS and PMOS transistors turn on. The term "turn on" refers to a MOS transistors forming a low source-to-drain resistance relative to a high source-to-drain resistance when the transistor is turned off.

An example of an ATD circuit is shown in FIG. 1, with the waveforms shown in FIG. 2. The ATD circuit of FIG. 1 comprises two ATD integrators 102 and 103, their output signal being combined into an output logic gate 106. The first ATD integrator 102 is driven by the address signal (addr) while the second ATD integrator 103 is driven by the complementary addr signal through the inverter 100. In the following description the delays introduced by the gates 100 and 106, and the ATD integrators 102 and 103 when switching in the pre charge state are not shown for sake of brevity in the drawings.

During the initial time frame 107 the ATD integrator 102 is in pre charge state while the ATD integrator 103 is in stand by. When the addr signal falling edge occurs at the time point 108 the ATD integrator 103 transitions into the pre charge state and its output 105n switches immediately from LO to HI, or from a first logic value to a second logic value opposite the first. The ATD integrator 102 goes in standby mode after a period of time td1, at the time point 109, when its output 104n switches from HI to LO. The logic gate 106 provides the ATD pulse between the time points 108 and 109 since both signals 104n and 105n are HI during this timeframe. In a similar way another ATD pulse is generated at the time point 110 for the rising edge of the addr signal.

An example of an ATD integrator in schematic form is shown in FIG. 3, and the waveforms over time on some significant nodes of this circuit are presented in FIG. 4. The waveforms names in FIG. 4 match the corresponding node names in FIG. 3. Referring to FIGS. 3 and 4, the ATD integrator may contain a signal input (in1), a signal output (out1), a control input (m1), two capacitors 19 and 23, a resistor 10, an inverter 8, a pre charge transistor 11, a capacitor switch 14 and an output gate 26.

The capacitor switch may include an inverter 12, and a pass gate 15 and 16. When the control input m1 is LO the capacitor 23 is disconnected from the node 20n. When m1 is HI, the pass gate is turned on (or "activated") and the capacitor 23 is connected to the node 20n in parallel to the capacitor 19.

The resistor 10 and the capacitors 19 and 23 form a simple RC integrator. For example, if the control input is LO, then the capacitor 23 is disconnected from the node 20n. Before the expected transition occurs at timeframe 27 the signal at the input in1 is HI, the node 9n is LO, the transistor 11 is turned on thereby pre charging the capacitor 19 at zero voltage (VSS). The output gate 26 has the transistor 25 turned on and the transistor 24 is turned off, therefore the output signal at node out1 is HI.

When the input signal transitions to LO (timeframe 32) the node 9n switches to HI and the transistor 11 turns off, enabling the capacitor 19 to be slowly charged through the resistor 10 until the voltage on node 20n reaches approximately the VDD level. The timeframe between 28 and 31 is also called "the integration time of the RC integrator".

At the time point 29 the transistor 24 begins to turn ON pulling the output out1 towards zero voltage. The input signal transition is transferred at the output out1 after it is delayed by the amount of time between the time points 32 and 33 as shown in FIG. 4.

Unfortunately, during the time period between 29 and 30, the voltage on node 20n is bigger than Vtn and smaller than VDD-Vtp, therefore both transistors 24 and 25 of the output gate 26 are on, or activated, allowing a large amount of current to flow between the power supply (VDD) and ground (VSS). If this timeframe is very large then a significant amount of energy from the power supply is wasted. Another disadvantage of this circuit is that the output transition may be very slow.

FIGS. 5 and 6 refer to a simplified block diagram of a section of the data read path that can be usually found in asynchronous memories. The address signal passing through the address input buffer 120 can split into two parallel paths: (i) the address path (via address decoders 123, wordline drivers 125) that enables the memory cell 130, and (ii) the ATD pulse path (via ATD block 122, buffers and control circuits 124). The ATD pulse is used to control the bit line equalizers 129 and the sense amplifiers 128. The signal transition 140 at the address pin is delayed by the amount of time Tdel 1 through the circuitry of the address path and enables the memory cell 130 at the time point 141. The signal transition 140 also triggers an ATD pulse that is delayed through the ATD pulse path by the amount of time Tdel 2. To ensure the correct functionality of the asynchronous memory read cycle the memory cell enable signal at node 127 must occur within the ATD pulse at node 126n. This important feature is pictured in FIG. 6 that shows the rising edge 141 occurring within the ATD pulse between time points 142 and 143.

It is very difficult to meet this requirement using conventional ATD integrators within an ATD circuit like those described in FIGS. 1-6 since any change in temperature, voltages of operation or fabrication process such as different doping concentrations, etch chemistry, etc., may affect differently the propagation time through the address path and ATD pulse path. Moreover, the ATD integrator uses a transition delay circuit that produces a delayed transition having an excessive transition time and which consumes too much power during the integration, or transition, time.

It would be desirable to implement an ATD integrator for use in the semiconductor memories, having an output gate with low power consumption during the integration time, a fast output transition at the end of the integration time, and also able to compensate the delay variations over process, voltage and temperature (PVT). The present invention provides a solution to these and other problems, and offers further advantages over conventional ATD integrator and methods of operating the same.

SUMMARY OF THE INVENTION

The following description of various embodiments of circuits and methods is not to be construed in any way as limiting the subject matter of the appended claims.

The problems outlined above are in large part solved by a memory device having an improved ATD system or circuit. The memory device can be any form of semiconductor memory and is preferably an asynchronous SRAM. The improved ATD system or circuit utilizes an improved ATD integrator. The ATD integrator has low power consumption during the integration time, a fast output transition at the end of the integration time and compensates the delay variations over PVT.

The preferred embodiments described below comprise an integrator having a feedback loop, a feedback loop switch, a precharge circuit, capacitor switches and an output gate connected to the input of the integrator amplifier. Before the expected transition of the input signal the capacitors are precharged between ground and the power supply voltage. After the input signal transition the integration time is controlled by the integrator and the RC devices, the feedback loop switch being active. During the integration time the output gate doesn't sink any current since only one transistor is turned on, or active. At the end of the integration time the feedback loop switch turns off disconnecting the integrator capacitances and converting the integrator into a simple amplifier. Since after interrupting the feedback loop there are no more significant capacitances connected to the amplifier's input the voltage on this node has a steep rising slope. As result the output gate switches fast sinking a small amount of current.

According to another embodiment, the improved ATD integrator is embodied upon preferably the same monolithic substrate as the memory. The memory is a semiconductor memory having an array of storage locations addressable by at least one address signal.

According to yet another embodiment, a method is provided for generating a steep transition at the input of the integrator's amplifier at the end of the integration time. The method consists of disconnecting the integrator's feedback loop at the end of the integration time.

BRIEF DESCRIPTION OF THE DRAWINGS

These and various other features and advantages of the present invention will be apparent upon reading of the following detailed description in conjunction with the accompanying drawings and the appended claims provided below, where:

Figure 1:
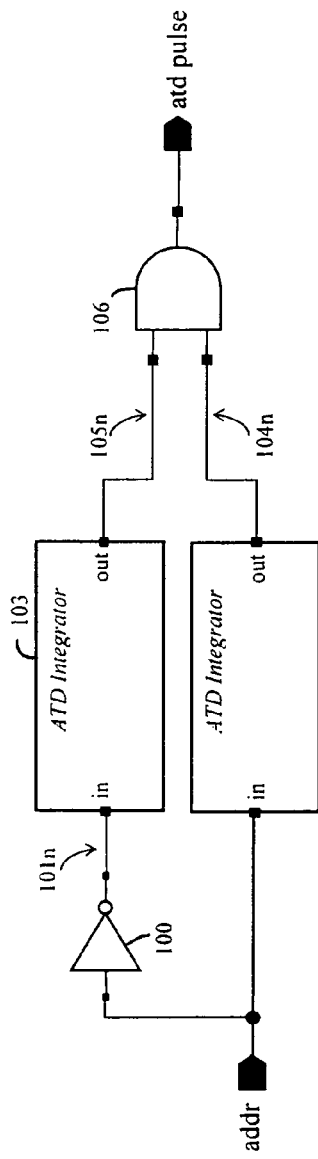
FIG. 1 is a block diagram of an ATD circuit.
Figure 2:
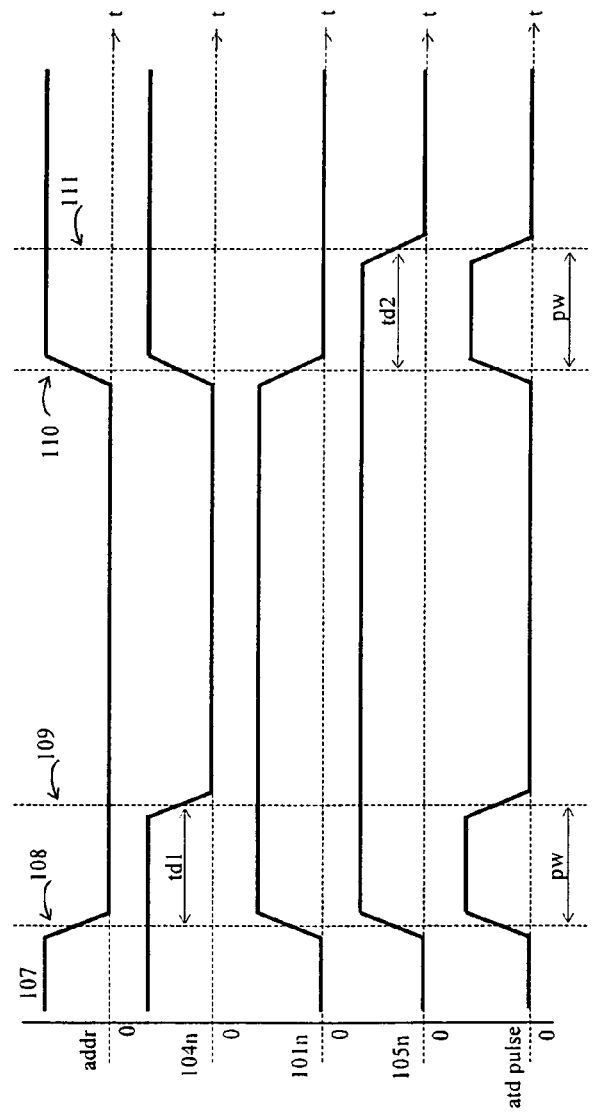
FIG. 2 is a graph of waveforms for the ATD circuit of FIG. 1.
Figure 3:
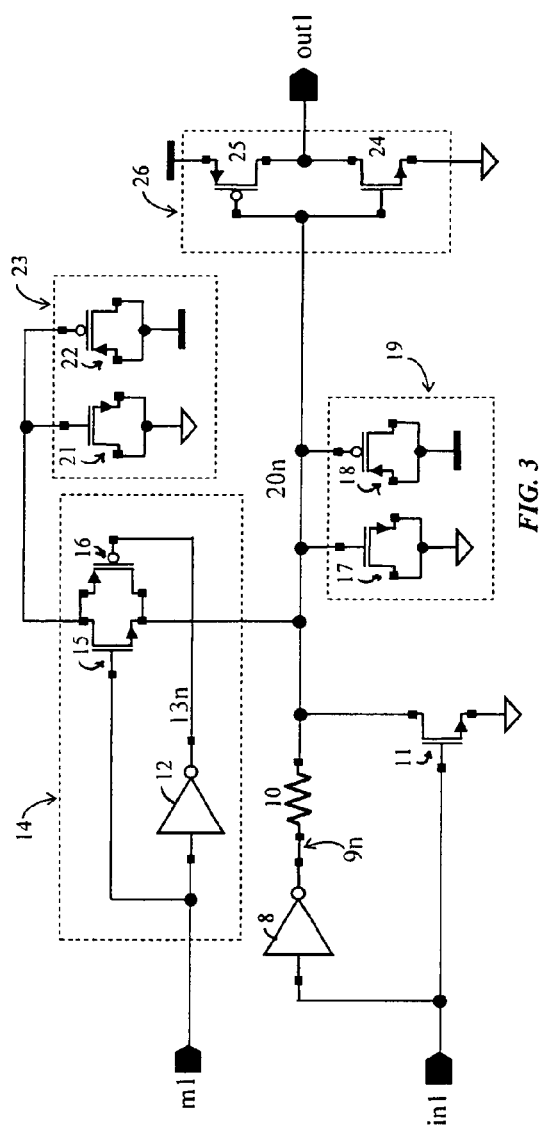
FIG. 3 is a simplified schematic diagram of a conventional ATD integrator.
Figure 4:
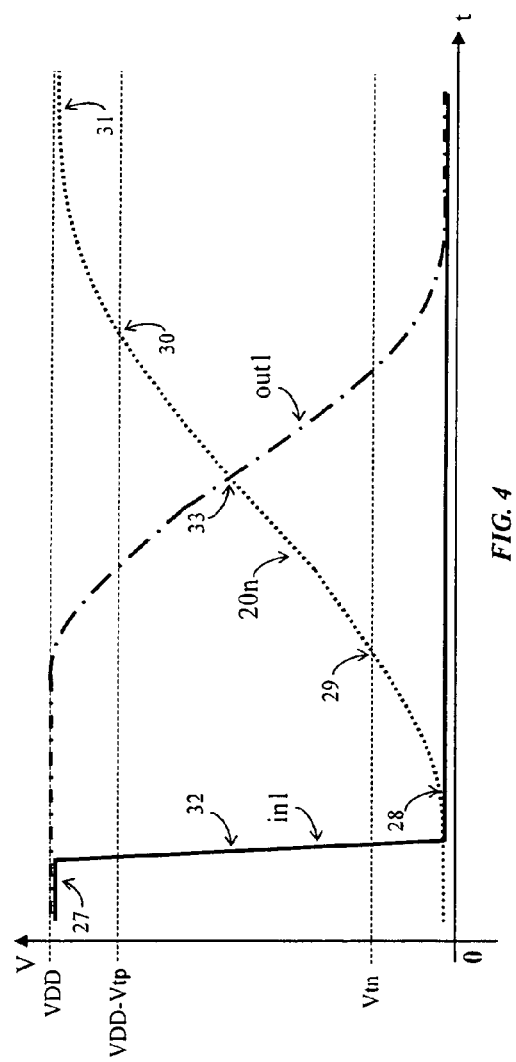
FIG. 4 is a graph of waveforms for the conventional ATD integrator of FIG. 3.
Figure 5:
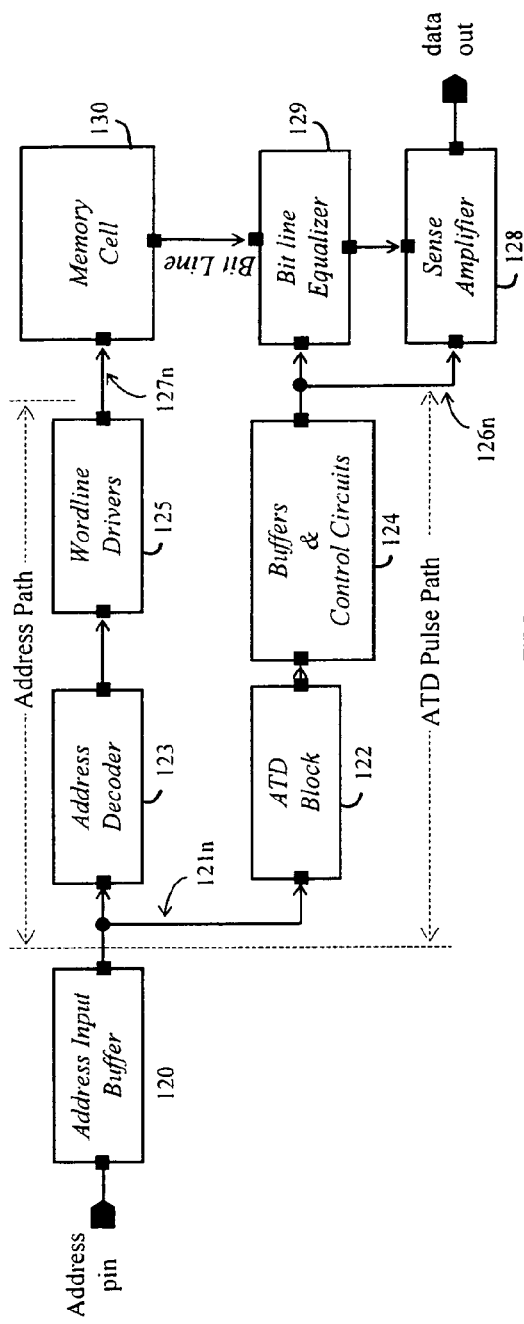
FIG. 5 contains a simplified block diagram of a section of the data read path used in an asynchronous memory.
Figure 6:
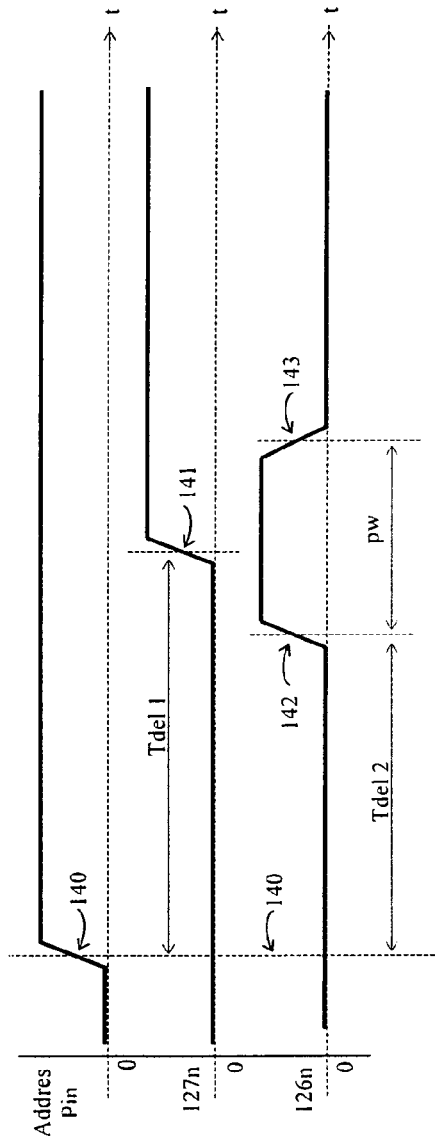
FIG. 6 is a graph of waveform of the block diagram presented in FIG. 5.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

A section of the read path in asynchronous memories undergoes ATD integration. The address signals (addr) control the memory cells passing through the address path, i.e. address decoders, word line drivers and other circuits. The transitions on the address bus also generate ATD pulses through the ADT circuit. The ATD pulses control the bit line equalizers, sense amplifiers, write circuits, output buffers passing through various circuits that form the ATD pulse path. Since over the PVT variations, the signal delay through the address path may be different from the signal delay through the ATD pulse path, the present ATD integrator has been created to compensate those variations and equalize the delay through the above mentioned paths. The present ATD integrator also ensures a low power consumption during the integration time and provides a relatively fast output transition (i.e., less than 0.5 ns from one logic state to the opposite logic state) at the end of the integration time.

Figure 7:
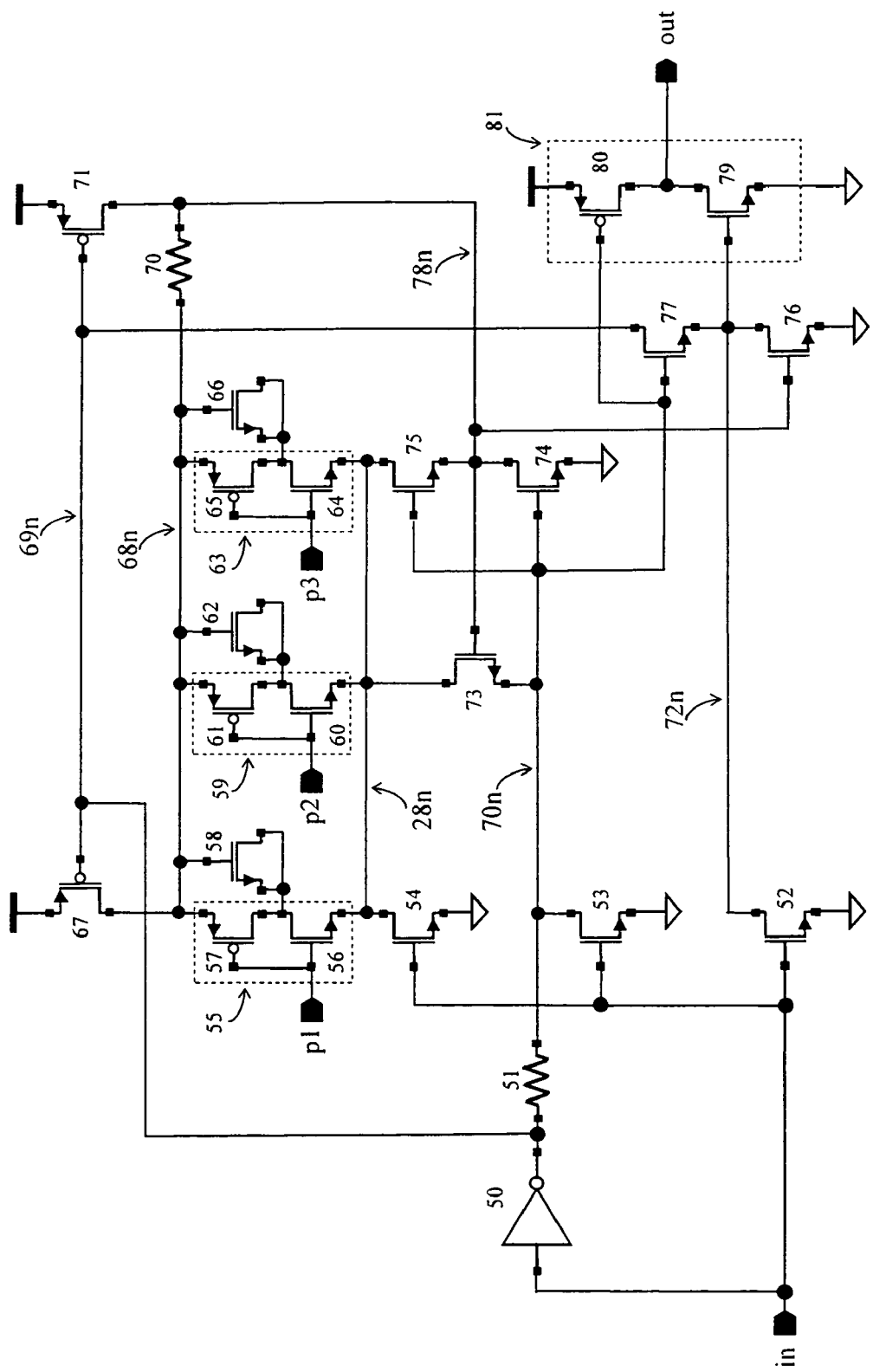
FIG. 7 is a simplified or partial schematic diagram of an ATD integrator that compensates the signal delay on the ATD pulse path over PVT ensuring low power consumption during the integration time and a fast output transition at the end of the integration time according to an embodiment of the present invention.
Figure 8:
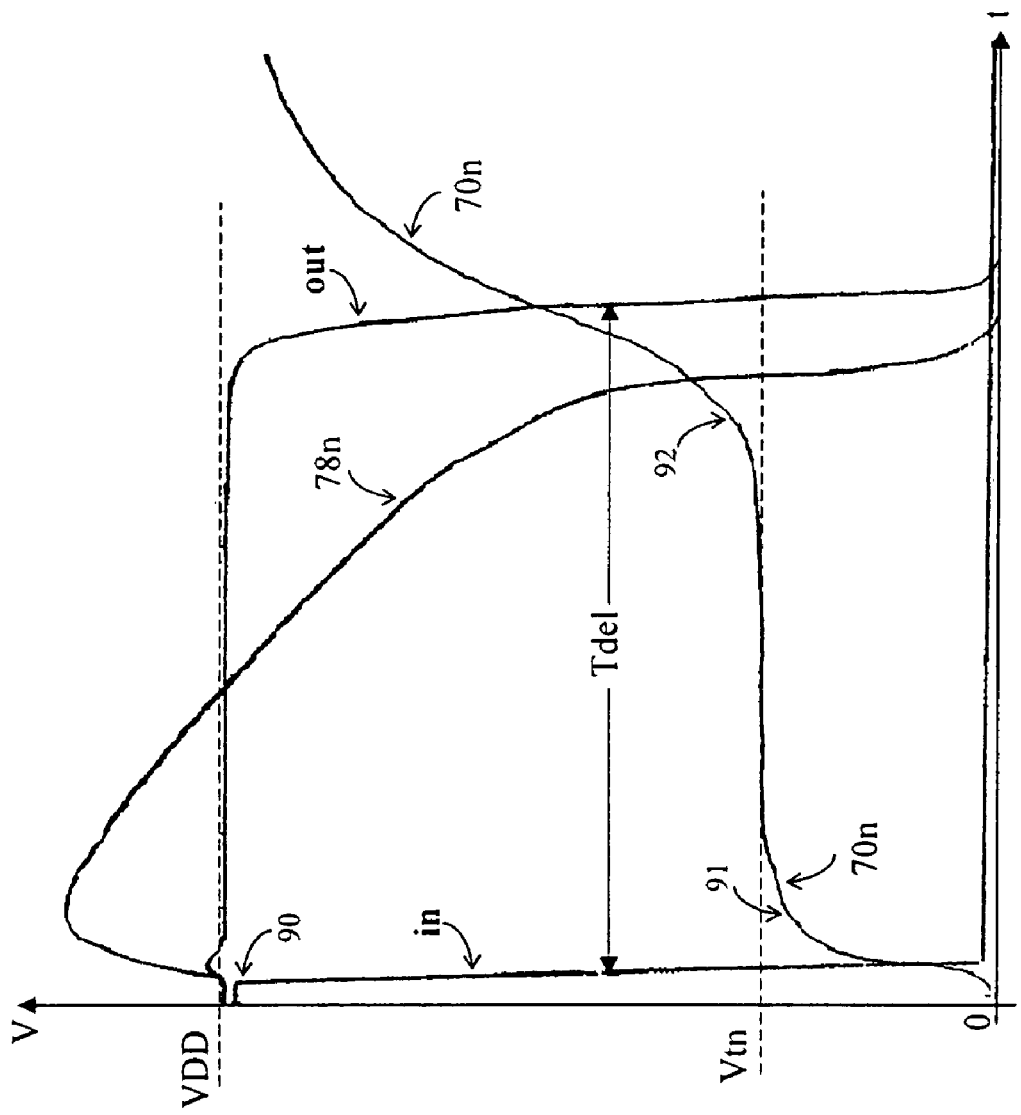
FIG. 8 shows graphs of waveforms over time for the ATD integrator according to an embodiment of the present invention.

A simplified, partial schematic diagram of an ATD integrator according to an embodiment of the present invention is shown in FIG. 7. The waveforms over time for the important nodes of the circuit in FIG. 7 are shown in FIG. 8. In the following descriptions "HI" refers to a voltage level close or equal to the voltage on the power supply node VDD, "LO" refers to a voltage level close or equal to the voltage on the ground supply node VSS and "Vtn" refers to the gate transition voltage of a NMOS transistor.

Referring to FIG. 7, the ATD integrator generally includes: (i) an amplifier 74, integrator capacitors 58, 62 and 66, resistor 51, switches 55, 59 and 63, precharge transistors 52, 53, 54, 67, 71 and 76, correction resistor 70, output gate 81; source follower 77, feedback loop switches 73 and 75, inverter 50, signal input (in), signal output (out), and capacitance control inputs p1, p2 and p3.

The integrator capacitance can be programmed to have different values by connecting HI or LO the capacitance control inputs p1, p2 and p3. For example, if p1 is HI and p2 and p3 are LO, then transistor 56, 61 and 65 are active while the transistors 57, 60 and 64 are inactive, or turned off. Capacitor 58 is connected between the nodes 68n and 28n while the capacitors 62 and 66 are disconnected from the node 28n. Therefore only the capacitor 58 contributes to the integration time. The integrator feedback loop includes resistor 70, capacitor 58, transistor 56 (as the capacitor switch) and transistor 73 (as the feedback loop switch). The capacitance control inputs p1, p2 and p3 state doesn't change during the normal operation of the ATD integrator.

While the input pin "in" is HI the node 69n is LO. The precharge transistors 52, 53, 54, 67, 71 are active, keeping the nodes 68n, 78n at HI level and the nodes 70n, 72n at LO level. Since the node 70n is LO the transistors 74, 75, 77 are inactive while the transistor 80 is ON. Since the node 72n is LO the transistor 79 is inactive and the output gate 81 does not sink any current from the power supply. Since the node 78n is HI both transistors 73 and 76 are active. Since both nodes 69n and 70n are LO there is no current flowing through the resistor 51. As result of the voltage configuration at this initial state the capacitor 58 is pre charged between VSS and VDD through the transistors 67, 54 and 71 and through the resistor 70. The output (out) is in HI state. This initial state of the circuit is pictured in FIG. 8 between time zero and the time point 90.

When the input signal switches to LO the node 69n goes HI, the precharge transistors 52, 53, 54, 67, 71 turn off, releasing the nodes 72n, 70n, 28n, 68n and 78n. The integrator's amplifier 74 becomes active and begins to sink current from the pre charged capacitor 58. The voltage decrease on the amplifier 74 drain is transmitted through the negative feedback loop 70, 58, 56 and 73 to the amplifier 74 input (node 70n) opposing back to the voltage decrease on the amplifier's drain. This makes the voltage on node 70n to be maintained constant at Vtn level and the voltage on node 78n to decrease slowly until the transistor 74 is no longer in the saturation region and therefore it is no longer able to act as an amplifier. The above description is pictured in FIG. 8 between time points 91 and 92. The transistor 73 is turned on, connecting the nodes 28n and 70n as long as the voltage on node 78n is bigger than 2*Vtn (one Vtn on the transistor 74 plus one Vtn on the transistor 73). The transistor 76 is ON as long as the voltage on node 78n is bigger than one Vtn.

When the falling voltage on node 78n reaches 2*Vtn the transistor 73 begins to turn off, disconnecting the capacitor 58 from the node 70n. At this moment, pictured in FIG. 8 by the time point 92, the feedback loop is interrupted, the capacitances connected to the node 70n are no longer significant allowing the voltage on node 70n to rise fast reaching shortly the HI level through the resistor 51 connected to the node 69n. In the same time the voltage on node 78n falls fast reaching shortly the VSS level (zero volts).

Looking at FIG. 8 the time point 91 represents the beginning of the integration time and the time point 92 represents the end of the integration time. At the end of the integration time 92 the transistors 75 and 74 are turned on, connecting the node 28n at VSS. The transistor 80 turns off. The transistor 76 turns off, releasing the node 72n and in the same time the transistor 77 turns on pulling the node 72n at HI level. As result the transistor 79 turns on driving fast the output (out) to LO.

The architecture of the presented embodiment of the ATD integrator ensures a fast switching of the output signal, minimizes the average current required by the output gate preventing its transistors to be on simultaneously during the integration time and improves the delay equalization between the "Address Path" and the "ATD Pulse Path".

The foregoing description of specific embodiments of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents.

What is claimed is:

1. A circuit, comprising an integrator coupled to an output gate having series-connected first and second transistors coupled between a power supply and ground, wherein the integrator includes an amplifier, a feedback loop, a feedback loop switch, and a resistor to prevent the first and second transistors of the output gate to be concurrently active.

2. The circuit according to claim 1, wherein the integrator further comprises a third transistor configured as a source follower having a source of the third transistor connected to a gate of the second transistor.

3. The circuit according to claim 2, wherein a gate of the third transistor is connected to a gate of a fourth transistor having a source connected to a ground supply and working as the amplifier of the integrator, whereby during an integration time of the integrator the voltage on a node, comprising a gate of the third transistor, is maintained constant and equal to Vtn, and the voltage on a gate of the second transistor is equal to zero due to the gate source voltage difference equal to Vtn of the third transistor, and thus the second transistor is off during an integration time.

4. The circuit according to claim 3, wherein the gate of the second transistor is connected to the drain of a fifth transistor, and wherein the fifth transistor is on during the integration time to ensure that the gate of the second transistor is held to zero volts, and thereby further ensuring the second transistor is off the integration time.

5. The circuit according to claim 4, wherein the gate of the fifth transistor is coupled to the node, and wherein at the end of the integration time the node being in a logic low state the fifth transistor is turned off.

6. The circuit according to claim 5, wherein the integrator further comprises a sixth transistor having the source connected to the gate of the fourth transistor, the gate connected to the drain of the fourth transistor and the drain connected to the node of the feedback loop, whereby during the integration time the negative feedback loop is enabled and, at the end of the integration time, the sixth transistor turns off thereby interrupting the negative feedback loop and thus enabling the voltage on node to rise rapidly turning off the first transistor, and further turning on the second transistor which in turn creates a steep slope on the output signal.

7. A memory system, comprising:
an array of storage locations addressable by at least one address signal;
an integrator circuit coupled to receive the address signal and produce an output having a transition that is delayed relative to a transition of the address signal;
a feedback circuit that is configured to couple a voltage stored upon a capacitor onto a transistor that regulates a voltage upon a node; and
an output circuit that produces a control signal onto the memory in response to the voltage upon the node.

8. The system as recited in claim 7, wherein the capacitor is charged when the address signal is in a precharge voltage state, and the capacitor is discharged when the address signal is in a read or write voltage state.

9. The system as recited in claim 7, wherein the integrator comprises a second transistor through which the capacitor is discharged below a value of substantially the combined threshold of the transistor and the second transistor causing the voltage upon the node to rise toward a power supply voltage and to pull the control signal to either the power supply voltage or a ground supply voltage depending on the voltage state of the address signal.

10. A circuit, comprising:
an input terminal resistively coupled to a node;
a transistor coupled to the node;
a capacitor coupled to an input of the transistor for regulating a voltage upon the node; and
an output having a pair of transistors coupled in series between a power supply and a ground supply and having an input of one of the pair of transistors coupled to the node and the other input of the pair of transistors coupled to an output of a regulating transistor whose input is coupled to the node.

11. The circuit as recited in claim 10, wherein the input is coupled through an inverter and a resistor to the node.

12. The circuit as recited in claim 10, wherein the other input of the pair of transistors is coupled to an output of another regulating transistor whose input is coupled to the input of the transistor.

13. The circuit as recited in claim 10, further comprising an output coupled to the output of the pair of transistors.

14. The circuit as recited in claim 10, wherein the capacitor is coupled between a drain node of the transistor and, through a resistive feedback, to a gate node of the transistor.

15. The circuit as recited in claim 10, further comprising a second capacitor selectively coupled in parallel with the capacitor via a switch.

16. The circuit as recited in claim 10, wherein the pair of transistors are prevented from both being in a saturation region constituting a direct path between the power supply and ground regardless of the voltage value upon the input terminal.

17. The circuit as recited in claim 10, wherein one of the pair of transistors transitions on to cause an output from the circuit to transition at substantially the same rate as the transition of an input applied to the input terminal yet at a delay in time from the input.

18. The circuit as recited in claim 10, wherein one of the pair of transistors transitions off and the other of the pair of transistors transitions on to cause an output from the circuit to transition at least as fast as a rate as a transition of an input signal applied to the input terminal yet the output transition is delayed in time relative to the input signal.

19. A method for generating an output signal delayed from an input signal, comprising:
receiving an input signal having a voltage transition that changes according to an input transition rate;
resistively feeding the input transition onto a node;
capacitively regulating the voltage upon the node through a capacitor coupled across an output and input of a transistor coupled to the node; and
placing the voltage upon the node onto one transistor of a series-coupled pair of transistors and placing a voltage upon an output of a regulating transistor, whose gate is coupled to a gate of the transistor, onto the other transistor of the series-coupled pair of transistors to preclude concurrent activation of the pair of transistors and producing an output signal on the output of the pair of transistors having an output transition rate at least as fast as the input transition rate.

20. The method as recited in claim 19, wherein said resistively feeding comprises forwarding the input transition through a resistor onto the node.

21. The method as recited in claim 19, wherein said capacitively regulating comprises precharging the capacitor and thereafter discharging the capacitor through an amplifier transistor whose input is coupled to the node.

22. A method for generating a pulse, comprising:
charging a capacitor by applying a precharge voltage level upon an address signal;
discharging the capacitor by removing the precharge voltage level from the address signal, whereby a voltage is generated upon a node;
further discharging the capacitor for increasing the voltage upon the node above the pre-defined level; and
generating the pulse when the voltage upon the node is above the pre-defined level.

* * * * *